(12) United States Patent
Kim et al.

(10) Patent No.: US 10,969,702 B2
(45) Date of Patent: Apr. 6, 2021

(54) EXTREME ULTRAVIOLET LITHOGRAPHY APPARATUS

(71) Applicant: Samsung Electronics Co., Ltd., Suwon-si (KR)

(72) Inventors: Eokbong Kim, Hwaseong-si (KR); Mun ja Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/711,593

(22) Filed: Dec. 12, 2019

(65) Prior Publication Data
US 2021/0003929 A1 Jan. 7, 2021

(30) Foreign Application Priority Data
Jul. 5, 2019 (KR) .................. 10-2019-0081136

(51) Int. Cl.
| | | |
|---|---|---|
| *G03F 7/20* | (2006.01) | |
| *G03F 1/62* | (2012.01) | |
| *G02B 5/08* | (2006.01) | |
| *G03F 1/24* | (2012.01) | |
| *G02B 5/20* | (2006.01) | |

(52) U.S. Cl.
CPC ....... *G03F 7/70983* (2013.01); *G02B 5/0891* (2013.01); *G02B 5/208* (2013.01); *G03F 1/24* (2013.01); *G03F 1/62* (2013.01); *G03F 7/70191* (2013.01)

(58) Field of Classification Search
CPC ............. G03F 7/70983; G03F 7/70191; G02B 5/0891; G02B 5/208
USPC .............................. 355/67–71; 430/5, 20, 30
See application file for complete search history.

(56) References Cited

U.S. PATENT DOCUMENTS

| | | | |
|---|---|---|---|
| 7,250,620 | B2 | 7/2007 | Wurm et al. |
| 8,018,578 | B2 | 9/2011 | Banine et al. |
| 9,041,905 | B2 | 5/2015 | Ehm et al. |
| 9,703,187 | B2 | 7/2017 | Ono et al. |
| 9,989,844 | B2 | 6/2018 | Yakunin et al. |
| 10,073,361 | B2 | 9/2018 | Ehm et al. |
| 2006/0160031 | A1* | 7/2006 | Wurm ............... G21K 1/10 430/322 |
| 2014/0168758 | A1 | 6/2014 | Rose et al. |
| 2015/0192861 | A1* | 7/2015 | Banine ............... G03F 7/70191 355/71 |
| 2017/0205704 | A1 | 7/2017 | Nikipelov et al. |

* cited by examiner

*Primary Examiner* — Hung Nguyen
(74) *Attorney, Agent, or Firm* — Harness, Dickey & Pierce, P.L.C.

(57) ABSTRACT

An EUV lithography apparatus may include a light source, an EUV mask and a carbon-based optical filter. The light source may generate an EUV light. The EUV mask may be configured to apply the EUV light to a photoresist film on a substrate. The carbon-based optical filter may filter a light having an OoB wavelength in the EUV light. Thus, the EUV light may not include the light having the OoB wavelength to decrease an error of a photoresist pattern formed using the EUV light.

16 Claims, 13 Drawing Sheets

EXTREME ULTRAVIOLET LITHOGRAPHY APPARATUS

CROSS-RELATED APPLICATION

This application claims priority under 35 USC § 119 to Korean Patent Application No. 10-2019-0081136, filed on Jul. 5, 2019 in the Korean Intellectual Property Office (KIPO), the contents of which are herein incorporated by reference in their entirety.

BACKGROUND

1. Field

Example embodiments related to an extreme ultraviolet lithography apparatus. More particularly, example embodiments related to an extreme ultraviolet lithography (EUV) apparatus configured to expose a photoresist film on a substrate using an EUV light.

2. Description of the Related Art

Generally, a lithography process using EUV light may use an optical module containing an EUV light source, an array of mirrors or lens, and an EUV mask to pattern a photoresist pattern. However, the EUV light may include a light having an out-of-band (OoB) wavelength. The light having the OoB wavelength may generate errors in a photoresist pattern.

In order to remove the light having the OoB wavelength from the EUV light a reflecting region at the peripheral portion of the EUV mask may be reduced. A pellicle may also be used to prevent a contamination of the EUV mask. However, the pellicle may reflect the light having the OoB wavelength. Thus, the EUV light reaching the photoresist pattern may include a great amount of the light having the OoB wavelength and may generate errors in the photoresist pattern.

SUMMARY

Example embodiments provide an extreme ultraviolet lithography (EUV) apparatus capable of removing a light having an OoB wavelength from an EUV light.

According to an example embodiment, an EUV lithography apparatus may include a light source, an EUV mask and a carbon-based optical filter. The light source may generate an EUV light. The EUV mask may be configured to pattern a photoresist film on a substrate with the EUV light. The carbon-based optical filter may filter a light having an OoB wavelength from the EUV light.

According to an example embodiment, an EUV lithography apparatus may include a light source, a reflective EUV mask, a pellicle, a dynamic gas lock (DGL) and a carbon-based DGL membrane. The light source may generate an EUV light. The reflective EUV mask may be configured to reflect the EUV light to a photoresist film on a substrate. The pellicle may be between the reflective EUV mask and the photoresist film. The DGL may be over the substrate. The carbon-based DGL membrane may be installed at the DGL to block a diffusion of a gas released from the photoresist film caused by the EUV light. The carbon-based DGL membrane may filter a light having an OoB wavelength from the EUV light.

According to an example embodiment, there may be provided an EUV lithography apparatus which may include a light source, a reflective EUV mask, a first mirror array, a pellicle, a carbon-based optical filter, a second mirror array, a dynamic gas lock (DGL) and a carbon-based DGL membrane. The light source may generate an EUV light. The reflective EUV mask may be configured to reflect the EUV light to a photoresist film on a substrate. The first mirror array may be between the light source and the reflective EUV mask, and may reflect the EUV light to the reflective EUV mask. The pellicle may be between the reflective EUV mask and the photoresist film. The carbon-based optical filter may be arranged between the light source and the reflective EUV mask and/or between the reflective EUV mask and the substrate to filter a light having an OoB wavelength from the EUV light. The second mirror array may be arranged between the reflective EUV mask and the substrate to reflect the EUV light to the substrate. The DGL may be over the substrate. The carbon-based DGL membrane may be installed at the DGL to block a gas released from the photoresist film by the EUV light. The carbon-based DGL membrane may filter the light having the OoB wavelength from the EUV light.

According to an example embodiment, the carbon-based optical filter may filter the light having the OoB wavelength from the EUV light. For example, when the EUV lithography apparatus may include the pellicle between the EUV mask and the photoresist film, the carbon-based DGL membrane may block the gas released from the photoresist film by the EUV light and filter the light having the OoB wavelength from the EUV light. Thus, the light OBL having the OoB wavelength may be filtered from the EUV light passing through the carbon-based optical filter to decrease the error of a photoresist pattern formed using the EUV light.

BRIEF DESCRIPTION OF THE DRAWINGS

Example embodiments will be more clearly understood from the following detailed description taken in conjunction with the accompanying drawings. FIGS. 1 to 17 represent non-limiting example embodiments as described herein.

FIG. 1 is a view illustrating an EUV lithography apparatus in accordance with an example embodiment;

FIG. 2 is a graph showing a transmittance of a carbon-based optical filter in the EUV lithography apparatus in FIG. 1 with respect to a light having an OoB wavelength;

FIG. 3 is a graph showing a transmittance of a carbon-based optical filter in the EUV lithography apparatus in FIG. 1 with respect to an EUV light;

FIG. 5 is a graph showing wave fronts of EUV lights with respect to various carbon-based optical filters;

FIGS. 6 and 7 are graphs showing thermal changes of a silicon membrane and a graphene membrane;

FIG. 8 is a cross-sectional view illustrating a carbon-based optical filter in accordance with an example embodiment;

FIG. 9 is a cross-sectional view illustrating a carbon-based optical filter in accordance with an example embodiment;

FIG. 10 is a view illustrating an EUV lithography apparatus in accordance with an example embodiment;

FIG. 11 is a view illustrating an EUV lithography apparatus in accordance with an example embodiment;

FIG. 12 is a view illustrating an EUV lithography apparatus in accordance with an example embodiment;

FIG. 13 is a view illustrating an EUV lithography apparatus in accordance with an example embodiment;

FIG. 14 is a view illustrating an EUV lithography apparatus in accordance with an example embodiment;

FIG. 15 is a view illustrating an EUV lithography apparatus in accordance with an example embodiment;

FIG. 16 is a view illustrating an EUV lithography apparatus in accordance with an example embodiment; and FIG. 17 is a flow chart illustrating a EUV lithography method using the EUV lithography apparatus in FIG. 12.

DETAILED DESCRIPTION OF EXAMPLE EMBODIMENTS

The terms "first" and "second" may be used herein to describe various elements, components, regions, layers, and/or sections, these elements, components, regions, layers, and/or sections, should not be limited by these terms. These terms are only used to distinguish one element from another element. Thus, a first element discussed below may be termed a second element without departing from the scope of this disclosure.

Spatially relative terms, such as "below," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When the terms "about" or "substantially" are used in this specification in connection with a numerical value, it is intended that the associated numerical value include a tolerance of ±10% around the stated numerical value. When ranges are specified, the range includes all values there between such as increments of 0.1%.

Hereinafter, example embodiments will be explained in detail with reference to the accompanying drawings.

Figure 1:
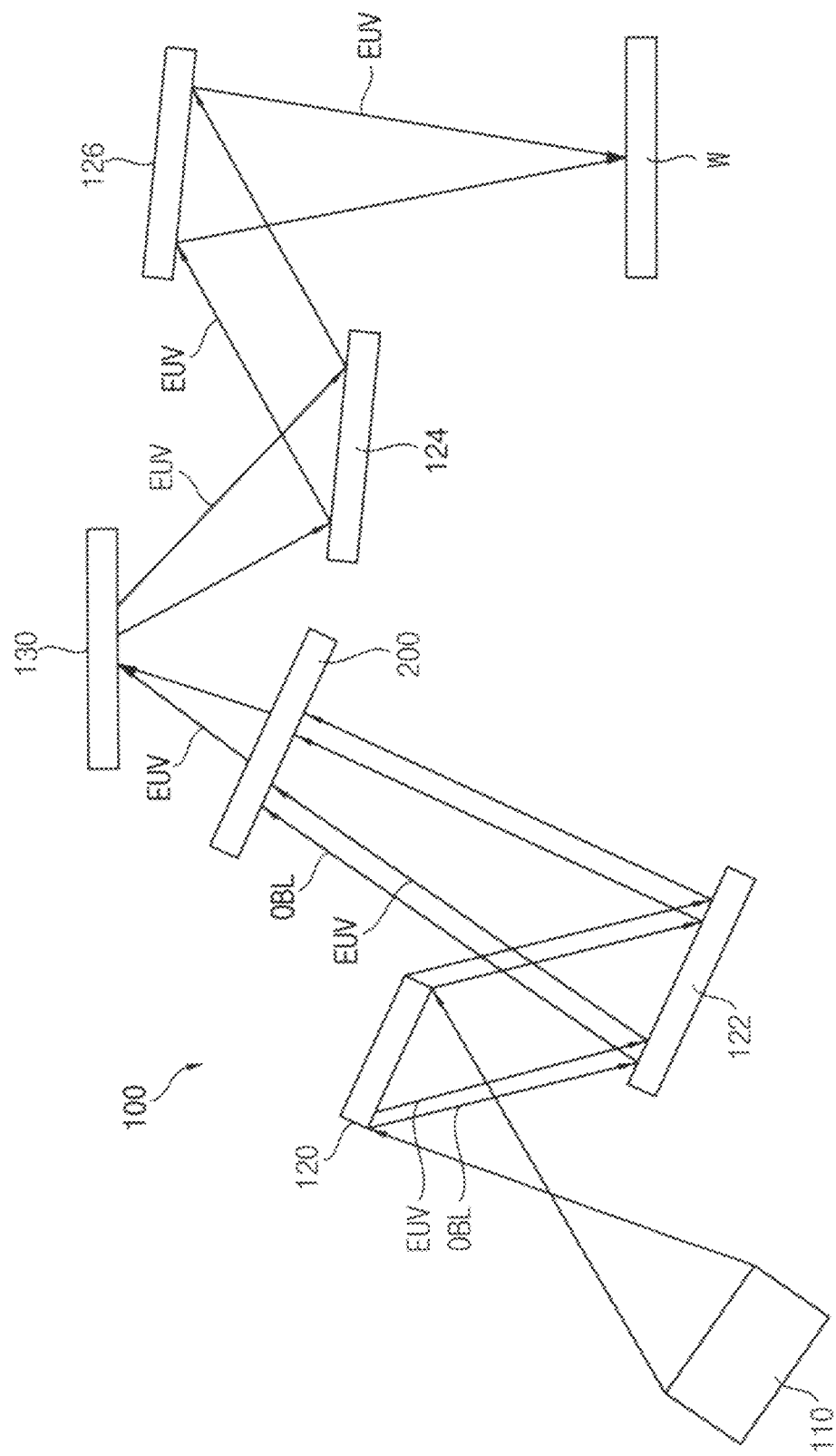

FIG. 1 is a view illustrating an EUV lithography apparatus in accordance with an example embodiment.

Referring to FIG. 1, an EUV lithography apparatus 100 of an example embodiment may include a light source 110, a first mirror array, a reflective EUV mask 130, a second mirror array and a carbon-based optical filter 200.

The reflective EUV mask 130 may be arranged between the light source 110 and a substrate W. Particularly, the reflective EUV mask 130 may be positioned on a plane higher than planes on which the light source 110 and the substrate W may be positioned. The first mirror array may be arranged between the light source 110 and the reflective EUV mask 130. The second mirror array may be arranged between the reflective EUV mask 130 and the substrate W. The carbon-based optical filter 200 may be arranged between the first mirror array and the reflective EUV mask 130.

The light source 110 may generate an EUV light. In an example embodiment, the light source 110 may generate the EUV light by an interaction between a laser and tin (Sn). The laser may have a wavelength of about 10.6 μm. The EUV light generated from the light source 110 may be directed to a photoresist film on the substrate W through the first mirror array, the reflective EUV mask 130 and the second mirror array. The EUV light may have a power of greater than about 200 W.

However, the EUV light generated from the light source 110 may include a light OBL having an OoB wavelength, particularly, about 100 nm to about 10 μm. The light OBL having the OoB wavelength may include an infrared light, an ultraviolet light, etc. The light OBL having the OoB wavelength may deform a wave front of the EUV light and generate an error on a photoresist pattern on the substrate W formed by the EUV light.

The first mirror array may include a first mirror 120 and a second mirror 122. The first mirror 120 and the second mirror 122 may be sequentially arranged between the light source 110 and the reflective EUV mask 130. The second mirror 122 may be located under the first mirror 120. The first mirror 120 may reflect the EUV light and the light OBL having the OoB wavelength generated from the light source 110 to the second mirror 122. The second mirror 122 may reflect the EUV light and the light OBL having the OoB wavelength to the reflective EUV mask 130. Alternatively, the first mirror array may include one mirror or at least three mirrors.

As mentioned above, the carbon-based optical filter 200 may be arranged between the first mirror array and the reflective EUV mask 130. Particularly, the carbon-based optical filter 200 may be arranged between the second mirror 122 and the reflective EUV mask 130. The carbon-based optical filter 200 may filter the light OBL having the OoB wavelength in the EUV light. In contrast, the EUV light may pass mostly or completely through the carbon-based optical filter 200. Thus, the light OBL having the OoB wavelength may be filtered from the EUV light passing through the carbon-based optical filter 200.

The carbon-based optical filter 200 also have the above-mentioned functions with a low transmittance of the light OBL having the OoB wavelength, a high transmittance of the EUV light, a low influence with respect to a wave front of the EUV light, good heat resistance with respect to the EUV light, etc. The carbon-based optical filter 200 may include a carbon-based film. For example, the carbon-based optical filter 200 may include a graphene film. The carbon-based film may be a free-standing type without a grid.

Figure 2:
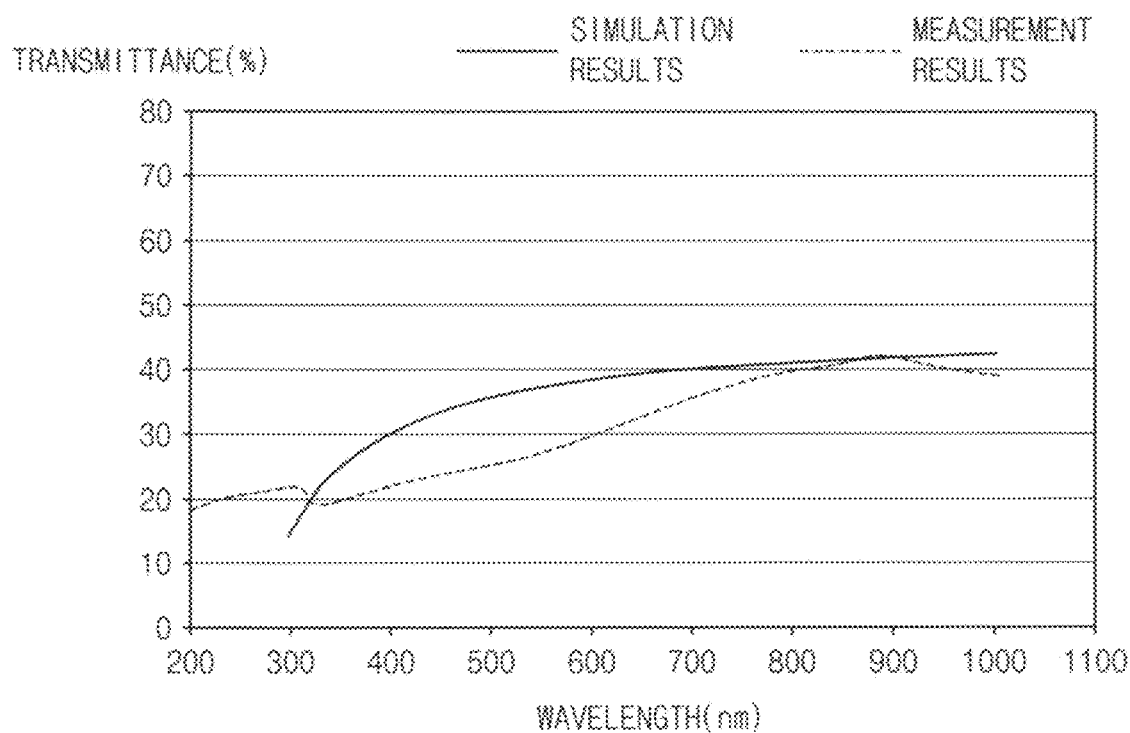

FIG. 2 is a graph showing a transmittance of a carbon-based optical filter in the EUV lithography apparatus in FIG. 1 with respect to a light having an OoB wavelength.

As shown in FIG. 2, the carbon-based film used in the carbon-based optical filter 200 of an example embodiment may have a transmittance of about 20% with respect to the ultraviolet light and a transmittance of about 40% with respect to the infrared light. Thus, it can be noted that the carbon-based film may have good filtering efficiency of the light OBL having the OoB wavelength.

Figure 3:
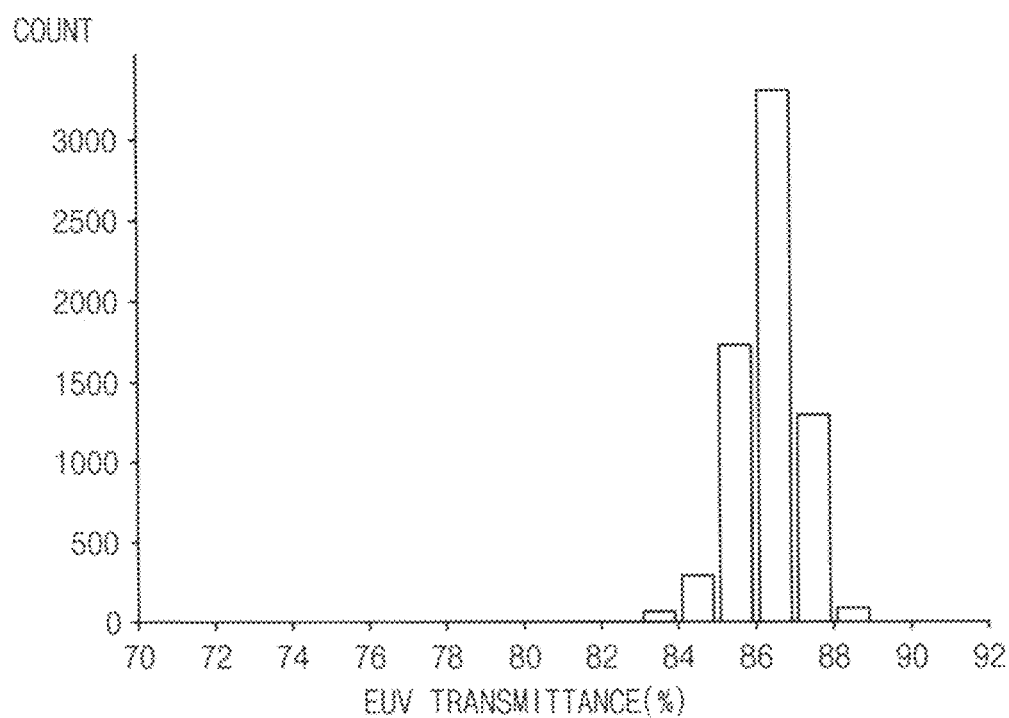

FIG. 3 is a graph showing a transmittance of a carbon-based optical filter in the EUV lithography apparatus in FIG. 1 with respect to an EUV light.

As shown in FIG. 3, the carbon-based film used in the carbon-based optical filter 200 of an example embodiment may have a transmittance of about 86% with respect to the EUV light. Thus, it can be noted that the EUV light may go through the carbon-based film configured to filter the light OBL having the OoB wavelength mostly unhindered.

Figure 4A:
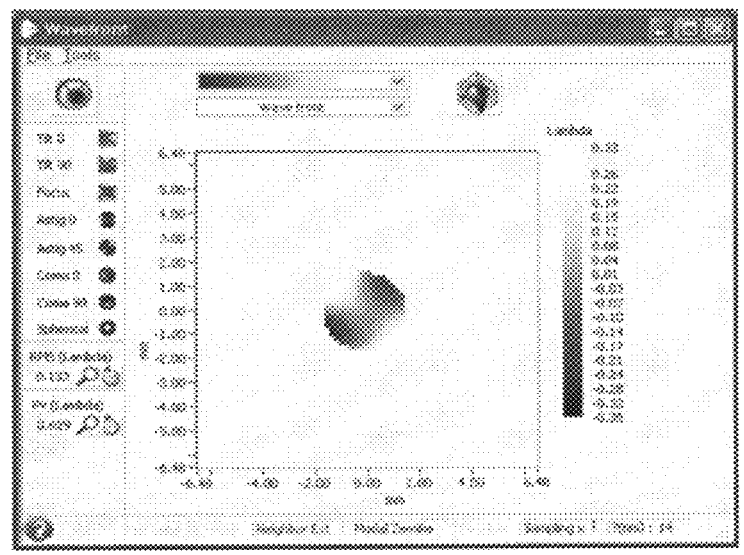
FIGS. 4A and 4B are views illustrating wave fronts of EUV lights in accordance with applying of a carbon-based optical filter.
Figure 4B:
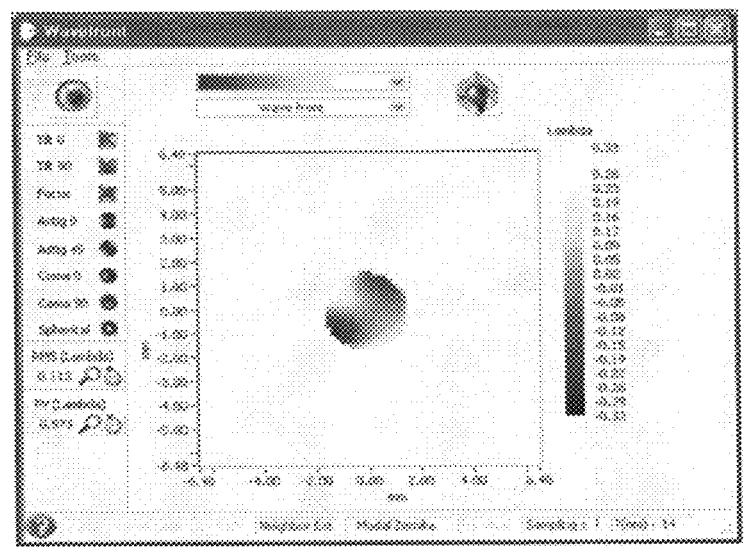

FIGS. 4A and 4B are views illustrating wave fronts of EUV lights in accordance with applying of a carbon-based optical filter. FIG. 4A may represent a wave front of the EUV light between Zernike term Z4~Z8 before the carbon-based film, and FIG. 4B may represent a wave front of the EUV light between Zernike term Z4~Z8 after the carbon-based film.

As shown in FIGS. 4A and 4B, a wave front error of the EUV light by the carbon-based film may be estimated as $\lambda\_EUV/530$. That is, it can be noted that the wave front of the EUV light may not be distorted because the carbon-based film used in the carbon-based optical filter 200 of an example embodiment may include the free-standing type without the grid.

Figure 5:
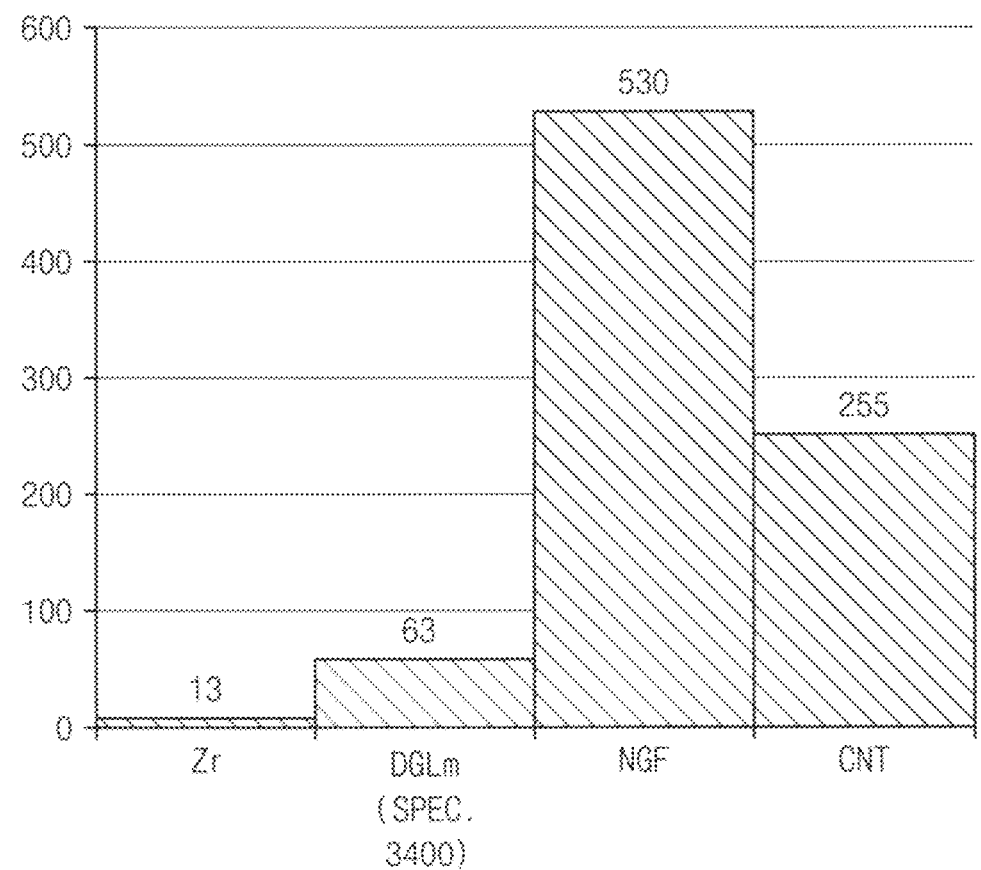

FIG. 5 is a graph showing wave fronts of EUV lights with respect to various carbon-based optical filters. Carbon-based optical filters used in FIG. 5 may include zirconium (Zr), a dynamic gas lock membrane (DGLm), a nanometer thickness graphite film (NGF) and/or carbon nanotubes (CNT).

The CNT may be a film, a sheet, an aligned array, a CNT-doped polymer film, etc., and may have filtering efficiency of the light OBL having the OoB wavelength lower than that of the NGF. In contrast, the CNT may have a transmittance of the EUV, strength, etc., greater than those of the NGF. As shown in FIG. 5, a wave front error of the EUV light by the CNT may be estimated as $\lambda\_EUV/255$.

Figure 6:
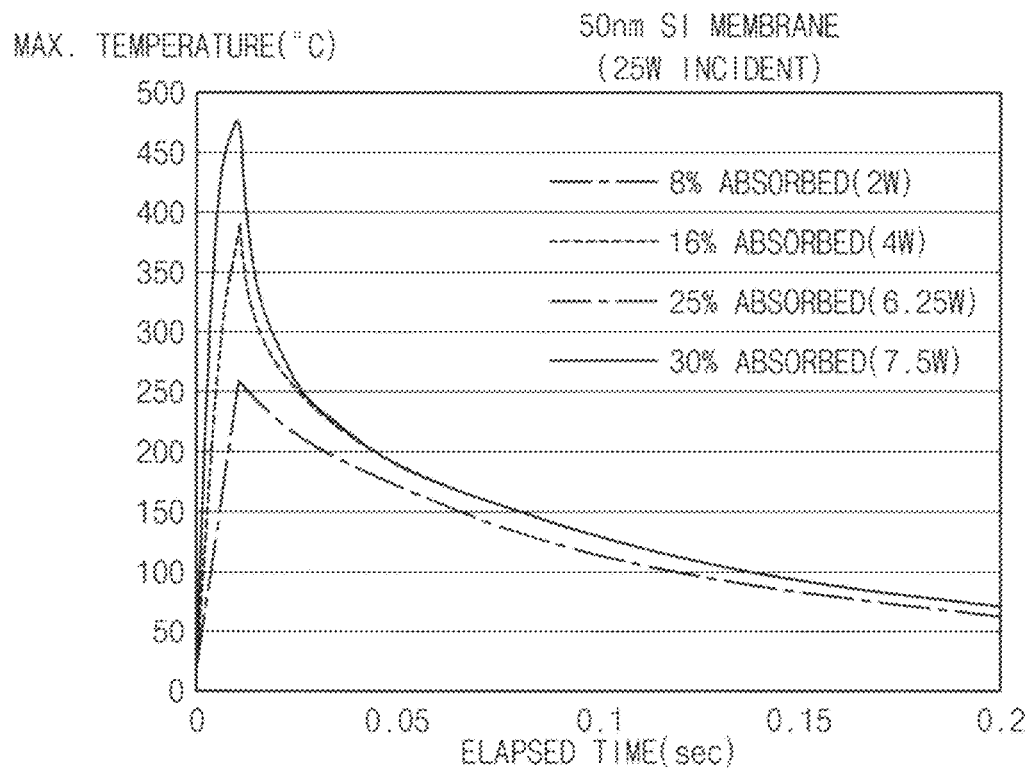
Figure 7:
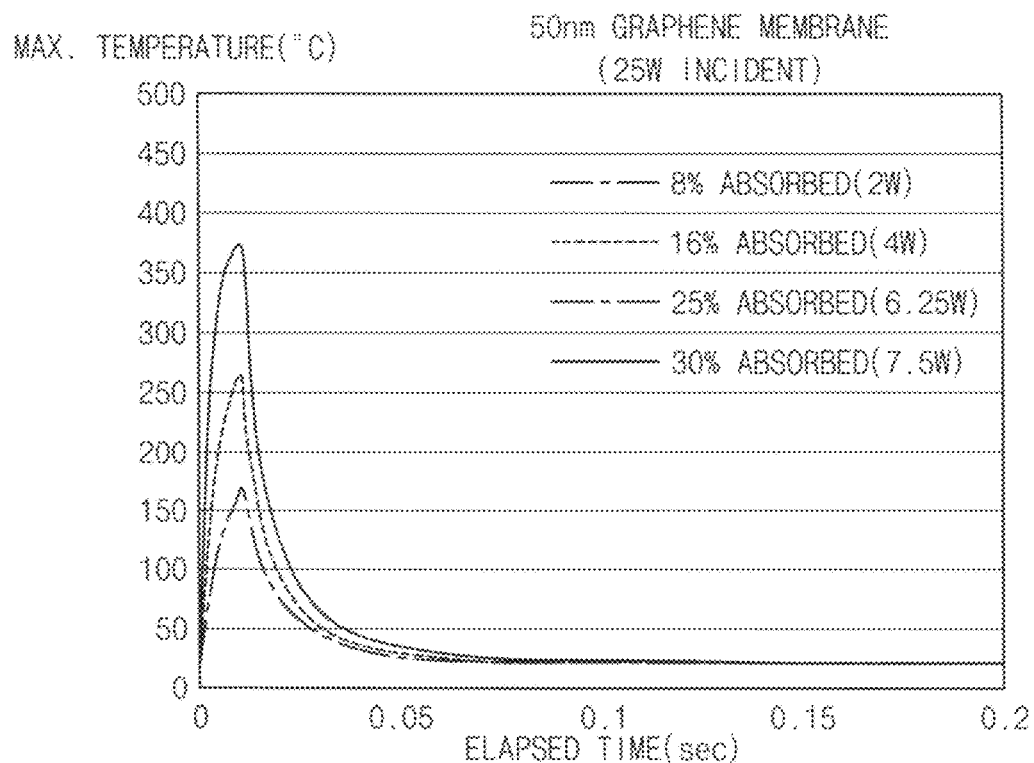

FIGS. 6 and 7 are graphs showing thermal changes of a silicon membrane and a graphene membrane. The silicon membrane and the graphene membrane may be used as the DGLm.

As shown in FIGS. 6 and 7, the graphene membrane may have heat resistance greater than that of the silicon membrane. Thus, when the graphene membrane is exposed to the EUV light with a high power and/or for a long time, the graphene membrane may be maintained with minimal or no damage.

The EUV light reflected from the second mirror 122 may go through the carbon-based optical filter 200 having the above-mentioned characteristics. That is, the EUV light may go through the carbon-based optical filter 200 with minimal or almost no loss. In contrast, the carbon-based optical filter 200 may block most or all of the light OBL having the OoB wavelength. Thus, the EUV light passing through the carbon-based optical filter 200 may almost not include the light OBL having the OoB wavelength.

The EUV light passing through the carbon-based optical filter 200 may be incident to the reflective EUV mask 130. The reflective EUV mask 130 may include a mask pattern. Thus, the EUV light incident to the reflective EUV mask 130 may include information of the mask pattern. The reflective EUV mask 130 may reflect the EUV light including the information of the mask pattern to the second mirror array.

The second mirror array may include a third mirror 124 and a fourth mirror 126. The third mirror 124 and the fourth mirror 126 may be sequentially arranged between the reflective EUV mask 130 and the substrate W. The fourth mirror 126 may be positioned over the third mirror 124. The third mirror 124 may reflect the EUV light reflected from the reflective EUV mask 130 to the fourth mirror 126. The fourth mirror 126 may reflect the EUV light to the substrate W. Alternatively, the second mirror array may include one mirror or at least three mirrors.

The EUV light irradiated to the substrate W may expose the photoresist film on the substrate W to form the photoresist pattern. Because the light OBL having the OoB wavelength in the EUV light may be mostly or completely removed by the carbon-based optical filter 200, errors in the photoresist pattern formed by the EUV light may be minimized or prevented.

Figure 8:
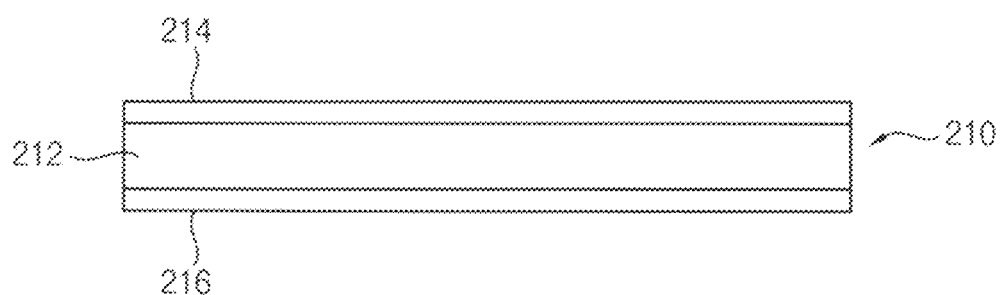

FIG. 8 is a cross-sectional view illustrating a carbon-based optical filter in accordance with an example embodiment.

Referring to FIG. 8, a carbon-based optical filter 210 of an example embodiment may include a zirconium base 212, a first carbon-based film 214 and a second carbon-based film 216. The first and second carbon-based films 214 and 216 may include materials substantially the same as that of the carbon-based optical filter 200 in FIG. 1.

The zirconium base 212 may have a first surface oriented toward the reflective EUV mask 130, and a second surface opposite to the first surface. The first carbon-based film 214 may be arranged on the first surface of the zirconium base 212. The second carbon-based film 216 may be arranged on the second surface of the zirconium base 212.

Alternatively, the carbon-based optical filter 210 of an example embodiment may include any one of the first carbon-based film 214 or the second carbon-based film 216.

Figure 9:
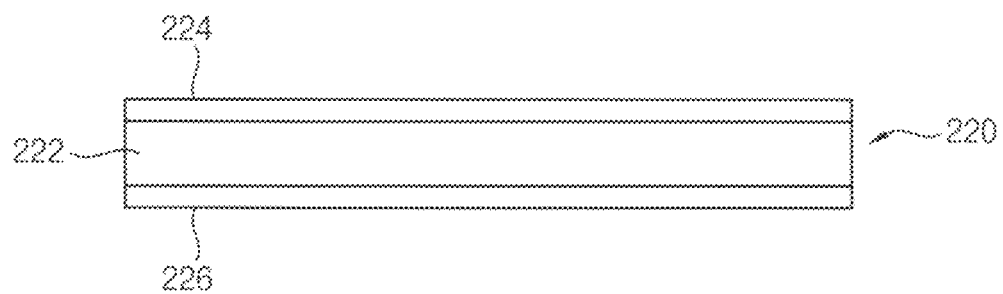

FIG. 9 is a cross-sectional view illustrating a carbon-based optical filter in accordance with an example embodiment.

Referring to FIG. 9, a carbon-based optical filter 220 of an example embodiment may include CNT 222, a first carbon-based film 224 and a second carbon-based film 226. The first and second carbon-based films 224 and 226 may include a material substantially the same as that of the carbon-based optical filter 200 in FIG. 1.

The CNT 222 may have a first surface oriented toward the reflective EUV mask 130, and a second surface opposite to the first surface. The first carbon-based film 224 may be arranged on the first surface of the CNT 222. The second carbon-based film 226 may be arranged on the second surface of the CNT 222.

Alternatively, the carbon-based optical filter 220 of an example embodiment may include any one of the first carbon-based film 224 or the second carbon-based film 226.

Figure 10:
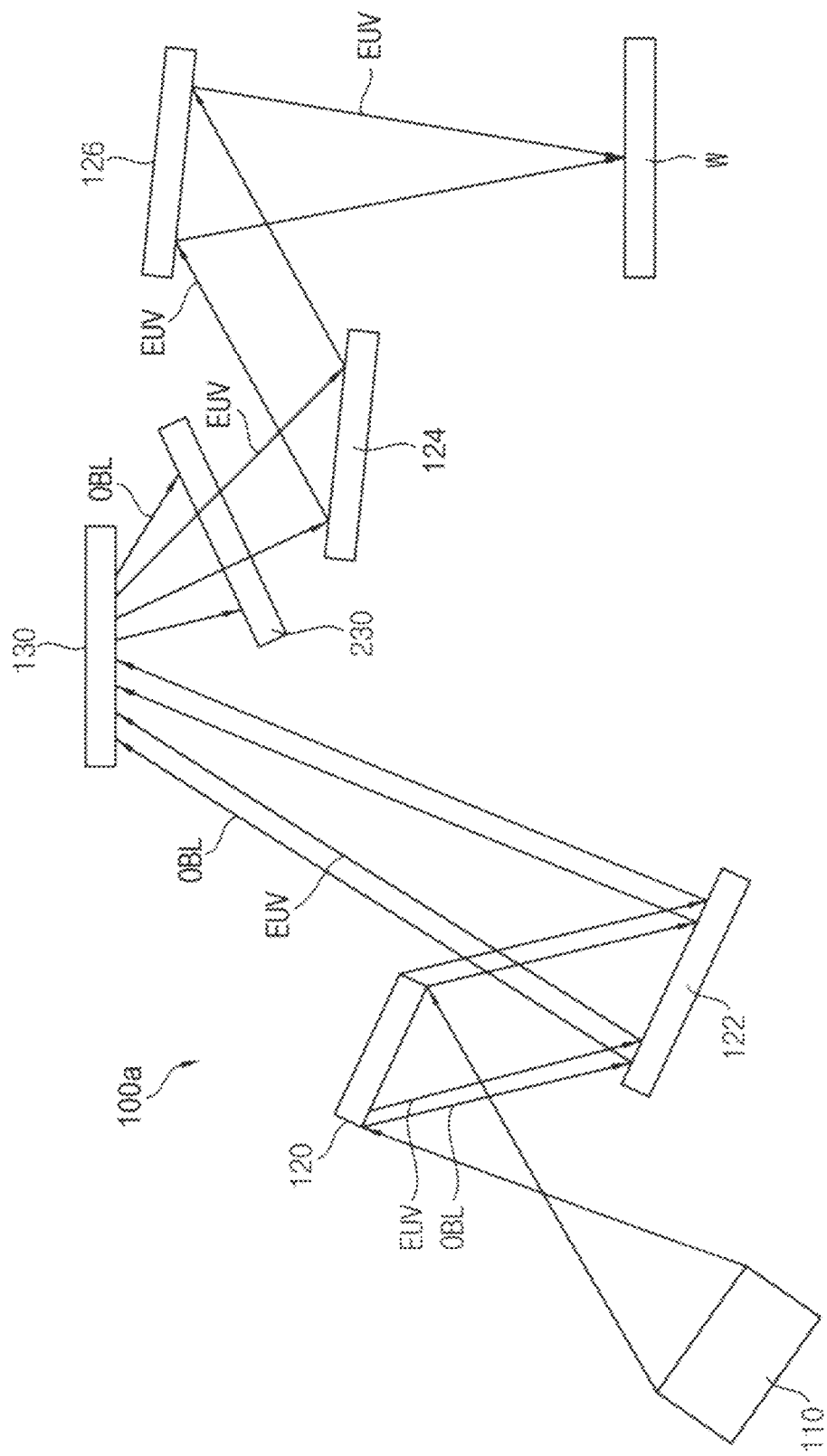

FIG. 10 is a view illustrating an EUV lithography apparatus in accordance with an example embodiment.

An EUV lithography apparatus 100a of an example embodiment may share elements substantially similar to those of the EUV lithography apparatus 100 in FIG. 1. Thus, the same reference numerals may refer to the same elements and any further illustrations with respect to the same elements may be omitted herein for brevity.

Referring to FIG. 10, a carbon-based optical filter 230 of example embodiment may be arranged between the reflective EUV mask 130 and the second mirror array. Particularly, the carbon-based optical filter 230 may be arranged between the reflective EUV mask 130 and the third mirror 124 of the second mirror array. The carbon-based optical filter 230 of an example embodiment may include a material and a structure substantially the same as those of the carbon-based optical filter 200 in FIG. 1.

Therefore, the carbon-based optical filter 230 may filter the light OBL having OoB wavelength from the EUV light reflected from the reflective EUV mask 130. As a result, the light OBL having the OoB wavelength might be reduced or eliminated from the EUV light transmitted to the third mirror 124 through the carbon-based optical filter 230.

Alternatively, the carbon-based optical filter 230 of an example embodiment may be replaced by the carbon-based optical filter 210 in FIG. 8 or the carbon-based optical filter 220 in FIG. 9.

Figure 11:
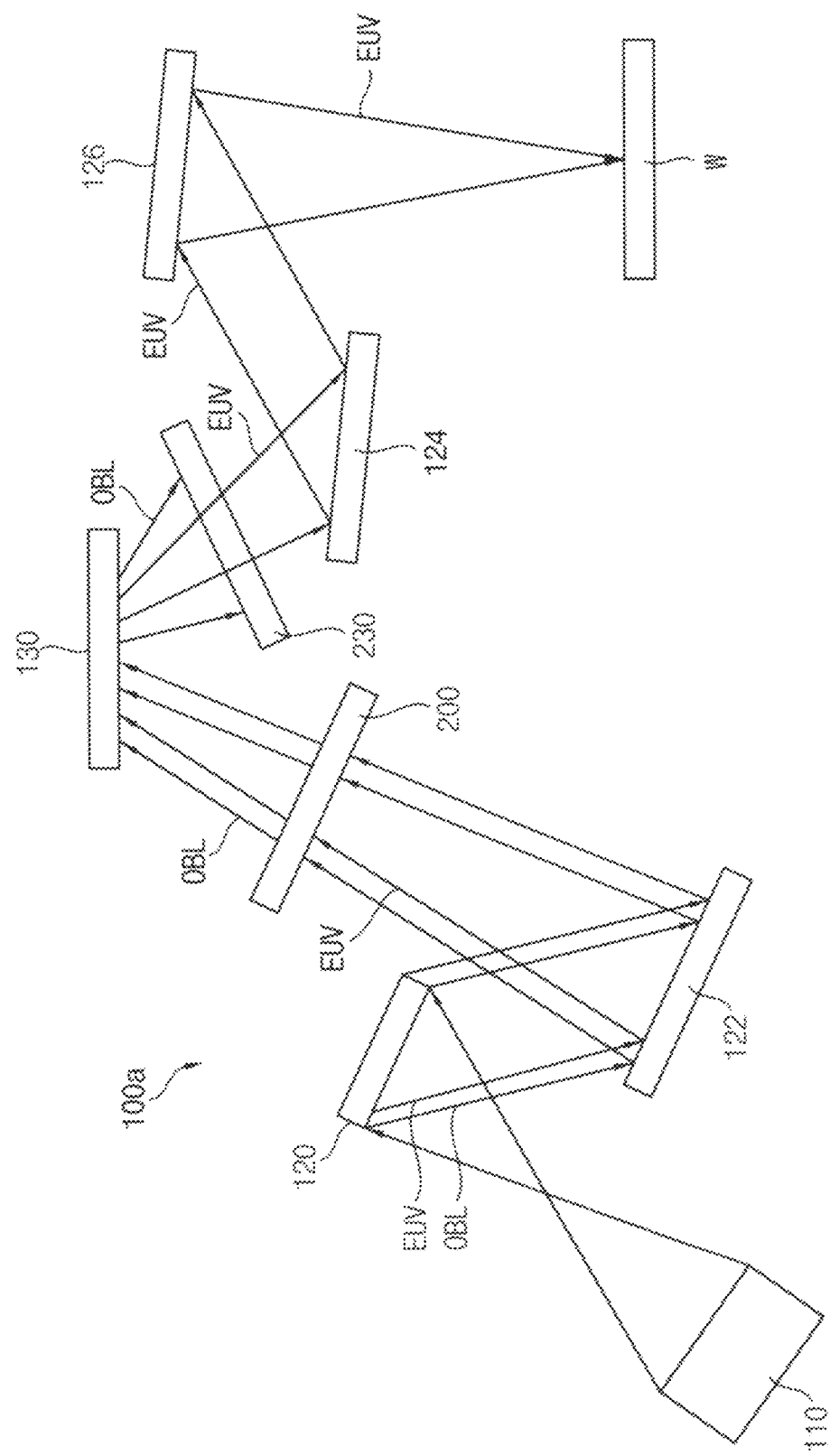

FIG. 11 is a view illustrating an EUV lithography apparatus in accordance with an example embodiment.

An EUV lithography apparatus 100b of an example embodiment may share elements substantially similar to those of the EUV lithography apparatus 100 in FIG. 1. Thus, the same reference numerals may refer to the same elements and any further illustrations with respect to the same elements may be omitted herein for brevity.

Referring to FIG. 11, an EUV lithography apparatus 100b of an example embodiment may include a carbon-based optical filter 200 (hereafter "the first carbon-based optical filter 200") and a carbon-based optical filter 230 (hereafter "the second carbon-based optical filter 230"). The first carbon-based optical filter 200 may correspond to the carbon-based optical filter 200 in FIG. 1. The second carbon-based optical filter 230 may correspond to the carbon-based optical filter 230 in FIG. 10.

Therefore, the first carbon-based optical filter 200 may be arranged between the second mirror 122 and the reflective EUV mask 130 to primarily filter the light OBL having OoB wavelength from the EUV light reflected from the second mirror 122 to the reflective EUV mask 130. The second carbon-based optical filter 230 may be arranged between the reflective EUV mask 130 and the third mirror 124 to secondarily filter the light OBL having OoB wavelength from the EUV light reflected from the reflective EUV mask 130.

According to an example embodiment, the light OBL having the OoB wavelength may be filtered twice from the EUV light using the two carbon-based optical filters 200 and 230.

Alternatively, each of the first and second carbon-based optical filters 200 and 230 of an example embodiment may be replaced by the carbon-based optical filter 210 in FIG. 8 or the carbon-based optical filter 220 in FIG. 9.

Figure 12:
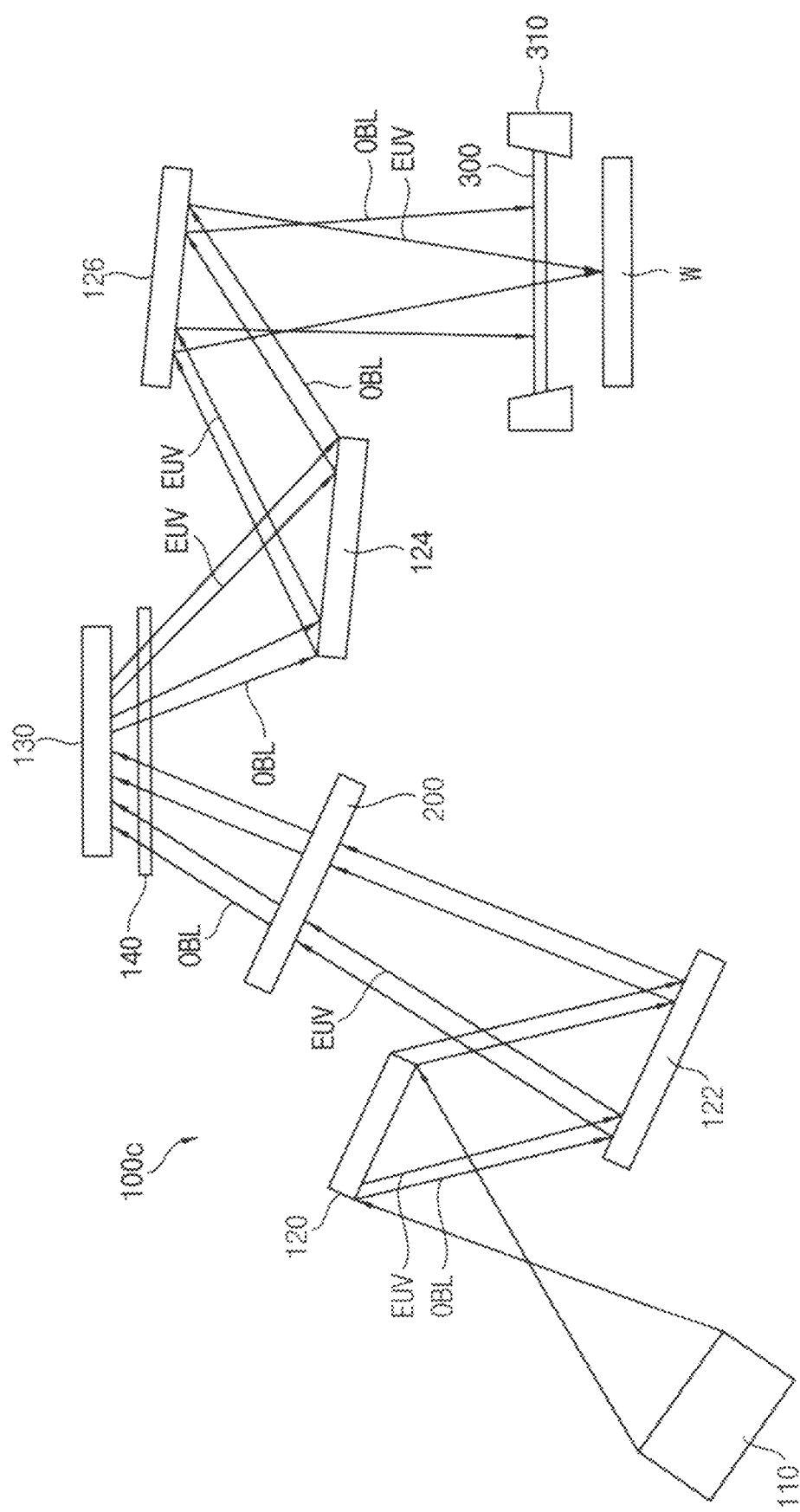

FIG. 12 is a view illustrating an EUV lithography apparatus in accordance with an example embodiment.

An EUV lithography apparatus 100c of an example embodiment may share elements substantially similar to those of the EUV lithography apparatus 100 in FIG. 1. Thus, the same reference numerals may refer to the same elements and any further illustrations with respect to the same elements may be omitted herein for brevity.

Referring to FIG. 12, the EUV lithography apparatus 100c may further include a pellicle 140, a DGL 310 and a carbon-based DGL membrane 300. The pellicle 140 may be arranged at a front of the reflective EUV mask 130 to protect the reflective EUV mask 130. The pellicle 140 may be configured to block gaseous or expelled byproducts generated in a lithography process and prevent contamination of the reflective EUV mask 130 by the byproducts.

Although the light OBL having the OoB wavelength in the EUV light may be filtered by the carbon-based optical filter 200, the pellicle 140 may reflect some of the light OBL having the OoB wavelength. The reflected light OBL having the OoB wavelength may not be blocked by the carbon-based optical filter 200, thus reaching the photoresist film on the substrate W.

Further, the EUV light reflected from the fourth mirror 126 may have a high power, and may release a gas from the photoresist film. The released gas may rise up and contaminate the first and second mirror arrays, the pellicle 140 and the reflective EUV mask 130.

In order to prevent the contaminations of the first and second mirror arrays, the pellicle 140 and the reflective EUV mask 130, a DGL 310 may be arranged over the substrate W. The DGL 310 may have an annular shape with an opening configured to expose a central portion of the substrate W. A blocking gas may be introduced onto the substrate W through the opening of the DGL 310. The released gas from the photoresist film and the blocking gas may be discharged through a space between the DGL 310 and the substrate W. Thus, the gas released from the photoresist film may not rise up.

A carbon-based DGL membrane 300 may also be arranged in the opening of the DGL 310. The carbon-based DGL membrane 300 may encompass the opening of the DGL 310. Thus, the gas released from the photoresist film may be blocked by the carbon-based DGL membrane 300. As a result, the released gas from the photoresist film may not rise up.

Further, the carbon-based DGL membrane 300 may include a carbon-based film. The carbon-based DGL membrane 300 may include a material and a structure substantially the same as those of the carbon-based optical filter 200. Thus, the carbon-based DGL membrane 300 may secondarily filter the light OBL having the OoB wavelength reflected from the pellicle 140. Therefore, the light OBL having the OoB wavelength may be filtered from the EUV light passing through the carbon-based DGL membrane 300. As a result, errors may be minimized or prevented in the photoresist pattern formed by the filtered EUV light.

Figure 13:
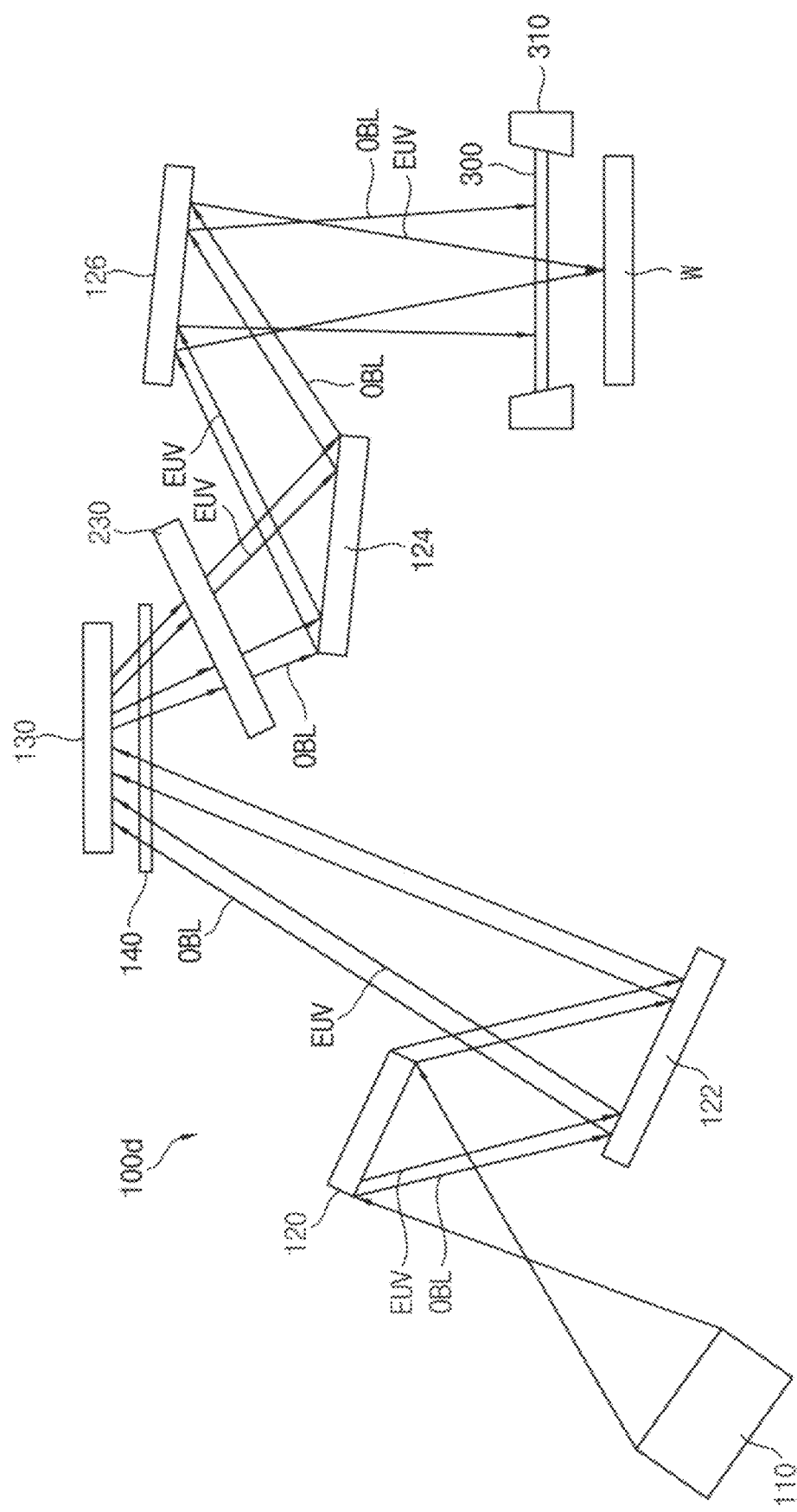

FIG. 13 is a view illustrating an EUV lithography apparatus in accordance with an example embodiment.

An EUV lithography apparatus 100d of an example embodiment may share elements substantially similar to those of the EUV lithography apparatus 100c in FIG. 12. Thus, the same reference numerals may refer to the same elements and any further illustrations with respect to the same elements may be omitted herein for brevity.

Referring to FIG. 13, a carbon-based optical filter 230 of an example embodiment may be arranged between the reflective EUV mask 130 and the second mirror array. Particularly, the carbon-based optical filter 230 may be arranged between the reflective EUV mask 130 and the third mirror 124 of the second mirror array. The carbon-based optical filter 230 of an example embodiment may include a material and a structure substantially the same as those of the carbon-based optical filter 200 in FIG. 12.

Therefore, the carbon-based optical filter 230 may filter the light OBL having OoB wavelength from the EUV light reflected from the reflective EUV mask 130. A carbon-based DGL membrane 300 may secondarily filter the light OBL having the OoB wavelength passing through the carbon-based optical filter 230. As a result, light OBL having the OoB wavelength may be filtered from the EUV light passing through the carbon-based DLG membrane 300.

According to an example embodiment, the light OBL having the OoB wavelength in the EUV light may be twice filtered from the EUV light using the carbon-based optical filter 230 and the carbon-based DLG membrane 300.

Alternatively, the carbon-based optical filter 230 of an example embodiment may be replaced by the carbon-based optical filter 210 in FIG. 8 or the carbon-based optical filter 220 in FIG. 9.

Figure 14:
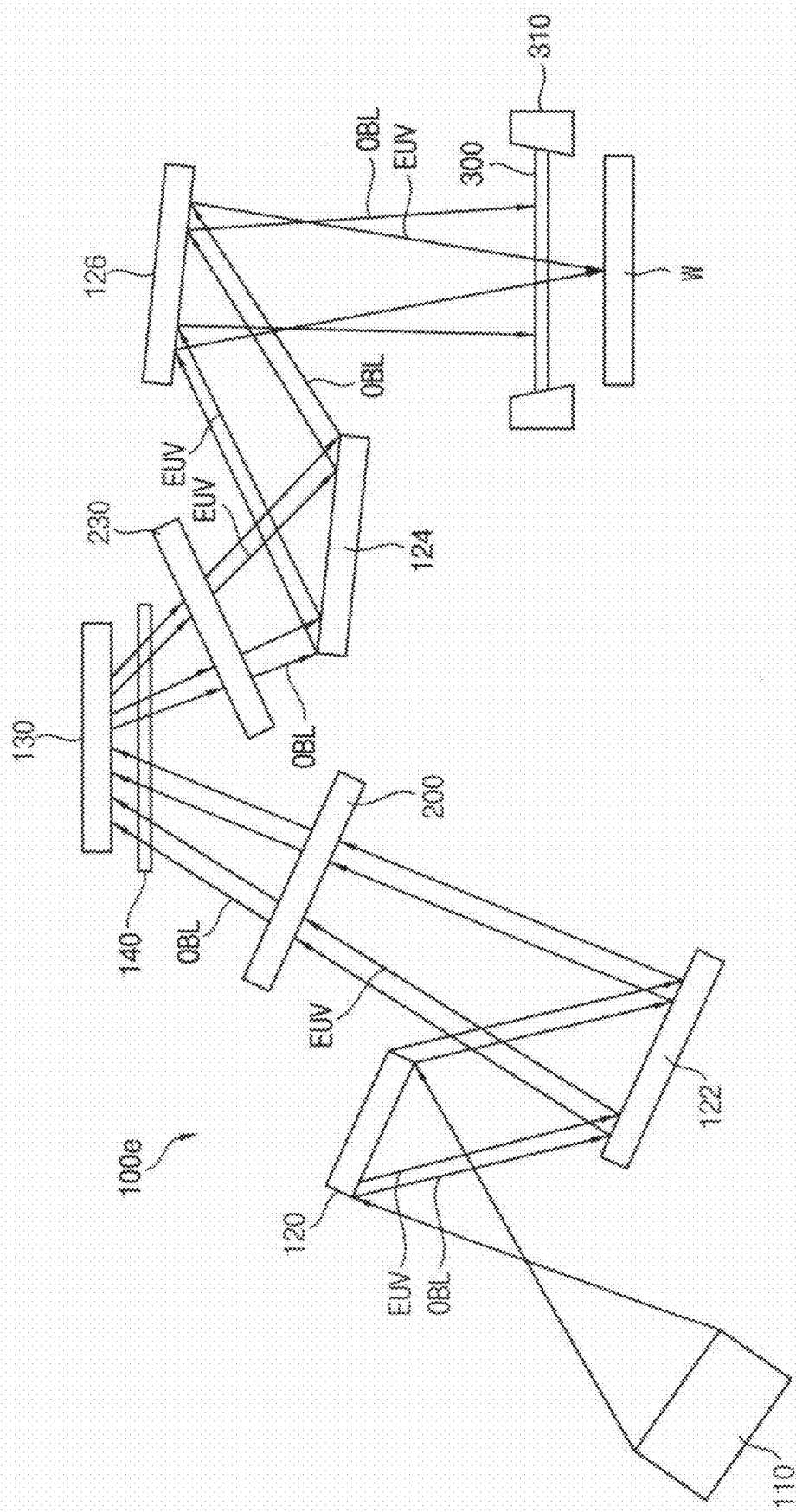

FIG. 14 is a view illustrating an EUV lithography apparatus in accordance with an example embodiment.

An EUV lithography apparatus 100e of an example embodiment may share elements substantially similar to those of the EUV lithography apparatus 100c in FIG. 12. Thus, the same reference numerals may refer to the same elements and any further illustrations with respect to the same elements may be omitted herein for brevity.

Referring to FIG. 14, an EUV lithography apparatus 100e of an example embodiment may include a first carbon-based optical filter 200 and a second carbon-based optical filter 230. The first carbon-based optical filter 200 may correspond to the carbon-based optical filter 200 in FIG. 12. The second carbon-based optical filter 230 may correspond to the carbon-based optical filter 230 in FIG. 13.

The first carbon-based optical filter 200 may be arranged between the second mirror 122 and the pellicle 140 to primarily filter the light OBL having OoB wavelength from the EUV light reflected from the second mirror 122 to the pellicle 140. The second carbon-based optical filter 230 may be arranged between the pellicle 140 and the third mirror 124 to secondarily filter the light OBL having OoB wavelength from the EUV light reflected from the reflective EUV mask 130. The carbon-based DGL membrane 300 may tertiarily filter the light OBL having the OoB wavelength from the EUV light passing through the second carbon-based optical filter 230. As a result, the light OBL having the OoB wavelength may be mostly or completely removed from the EUV light passing through the carbon-based DLG membrane 300.

According to an example embodiment, the light OBL having the OoB wavelength in the EUV light may be filtered three times using the two carbon-based optical filters 200 and 230 and the carbon-based DGL membrane 300.

Alternatively, each of the first and second carbon-based optical filters 200 and 230 of an example embodiment may be replaced by the carbon-based optical filter 210 in FIG. 8 or the carbon-based optical filter 220 in FIG. 9.

Figure 15:
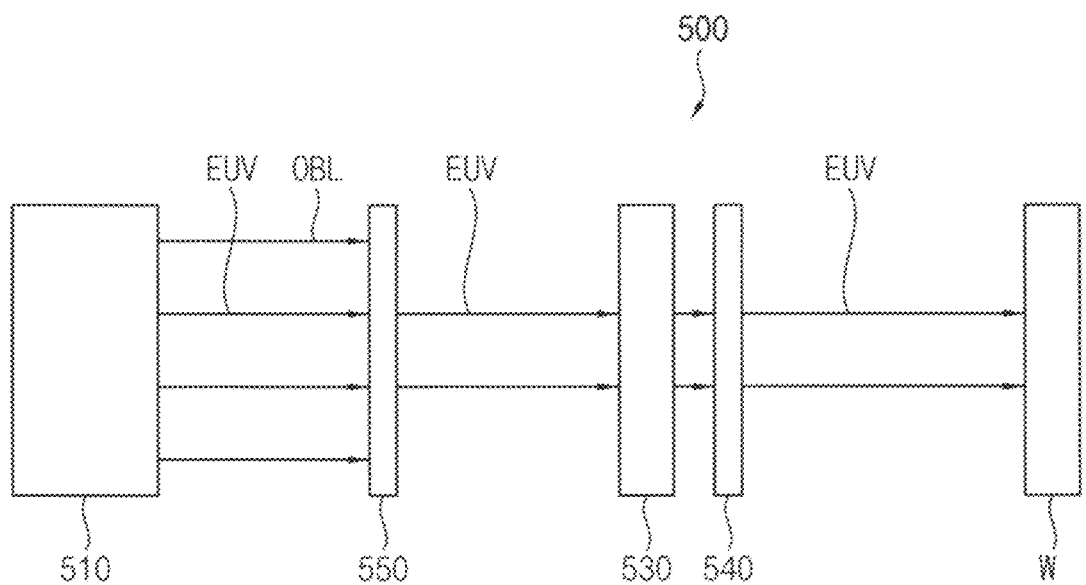

FIG. 15 is a view illustrating an EUV lithography apparatus in accordance with an example embodiment.

Referring to FIG. 15, an EUV lithography apparatus 500 of an example embodiment may include a light source 510, a transmissive EUV mask 530, a pellicle 540 and a carbon-based optical filter 550.

The transmissive EUV mask 530 may be arranged between the light source 510 and the substrate W. The transmissive EUV mask 530 may include a mask pattern. Thus, the EUV light incident to the transmissive EUV mask 530 may include information with respect to a mask pattern. The EUV light including the information of the mask pattern may be transmitted to the photoresist film on the substrate W through the transmissive EUV mask 530.

The pellicle 540 may be arranged between the transmissive EUV mask 530 and the substrate W. The pellicle 540 may have functions substantially the same as those of the pellicle 140 in FIG. 1.

The carbon-based optical filter 550 may be arranged between the light source 510 and the pellicle 540. The carbon-based optical filter 550 may have a material and a structure substantially the same as those of the carbon-based optical filter 200 in FIG. 1. Thus, the carbon-based optical filter 550 may filter the light OBL having the OoB wavelength from the EUV light while allowing the EUV light to pass through the carbon-based optical filter 550. Therefore, the light OBL having the OoB wavelength may be filtered from the EUV light passing through the carbon-based optical filter 200.

Alternatively, the carbon-based optical filter 550 of an example embodiment may be replaced by the carbon-based optical filter 210 in FIG. 8 or the carbon-based optical filter 220 in FIG. 9. Further, an example embodiment of the EUV lithography apparatus 500 may further include the carbon-based DGL membrane 300 in FIG. 12.

Figure 16:
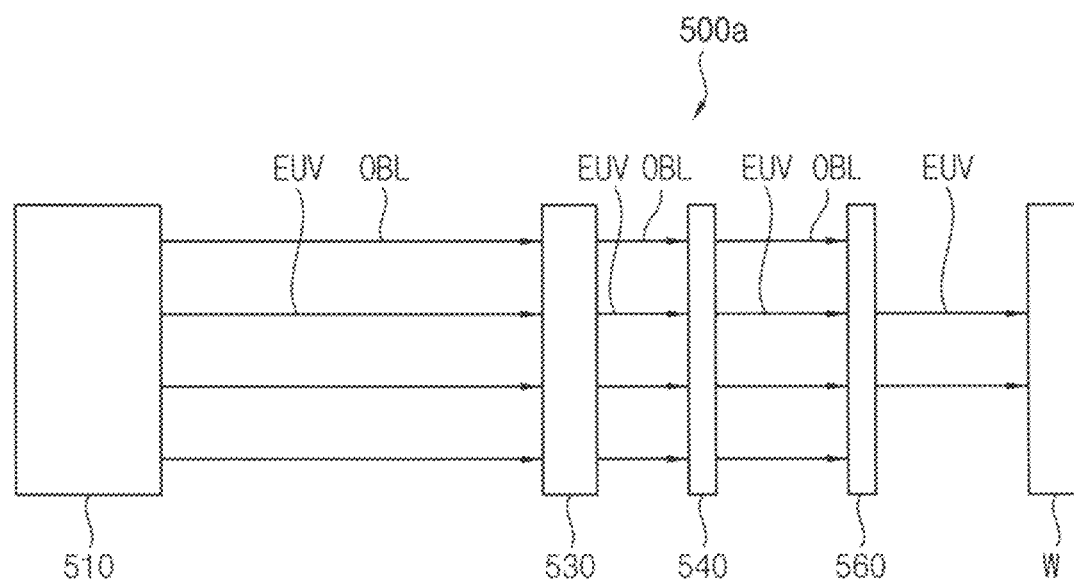

FIG. 16 is a view illustrating an EUV lithography apparatus in accordance with an example embodiment.

An EUV lithography apparatus 500a of an example embodiment may share elements substantially similar to those of the EUV lithography apparatus 500 in FIG. 15. Thus, the same reference numerals may refer to the same elements and any further illustrations with respect to the same elements may be omitted herein for brevity.

Referring to FIG. 16, a carbon-based optical filter 560 of an example embodiment may be arranged between the transmissive EUV mask 530 and the substrate W. The carbon-based optical filter 560 may have a material and a structure substantially the same as those of the carbon-based optical filter 550 in FIG. 15. Thus, the carbon-based optical filter 560 may filter the light OBL having the OoB wavelength from the EUV light passing through the transmissive EUV mask 530. As a result, the light OBL having the OoB wavelength may be filtered from the EUV light passing through the carbon-based optical filter 560.

Alternatively, the carbon-based optical filter 560 of an example embodiment may be replaced by the carbon-based optical filter 210 in FIG. 8 or the carbon-based optical filter 220 in FIG. 9. The EUV lithography apparatus 500a of an example embodiment may further include the carbon-based DGL membrane 300 in FIG. 12.

Further, an EUV lithography apparatus including the transmissive EUV mask 530 may include the carbon-based optical filters 550 and 560 in FIGS. 14 and 15.

Figure 17:
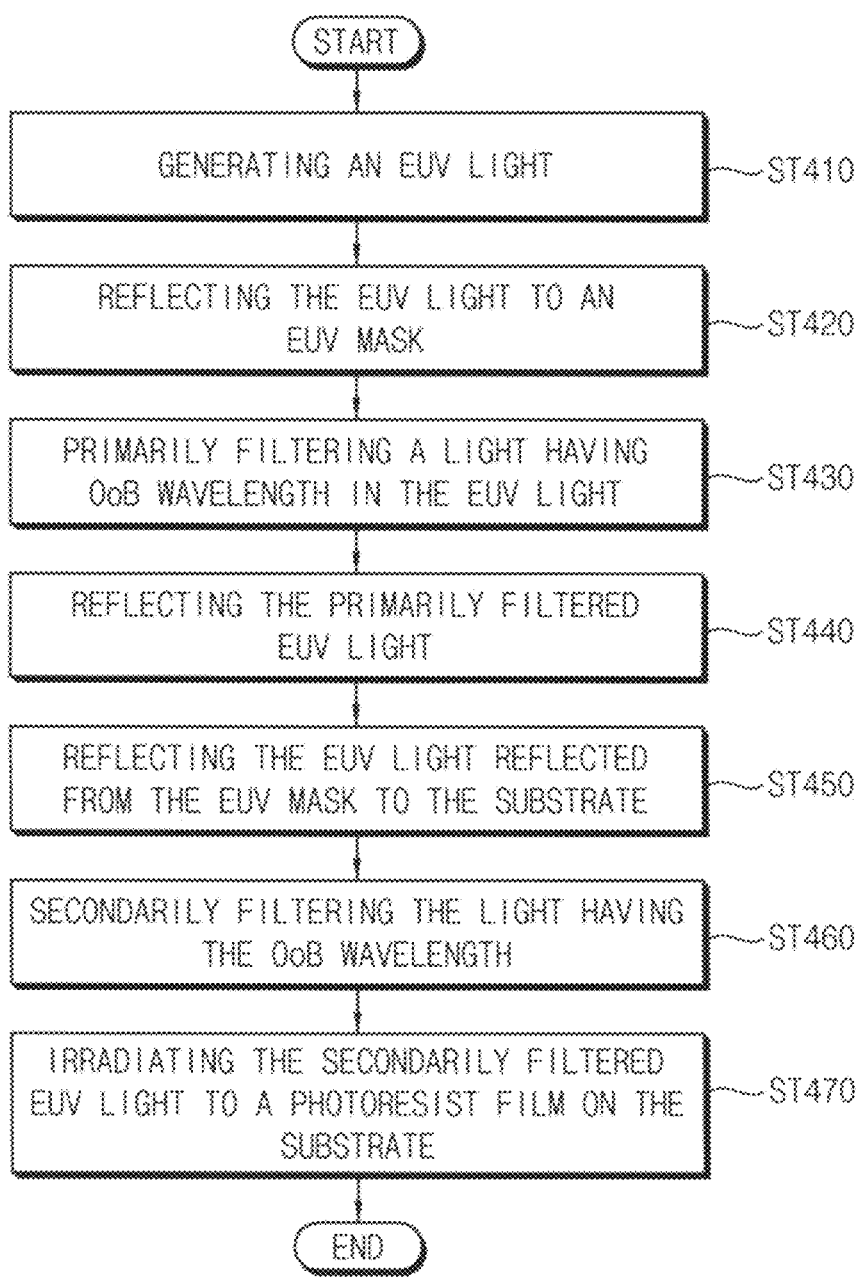

FIG. 17 is a flow chart illustrating an example EUV lithography method using the EUV lithography apparatus in FIG. 12.

Referring to FIGS. 12 and 17, in operation ST410, a light source 110 may generate EUV light.

In operation ST420, a first mirror array may reflect the EUV light to a reflective EUV mask 130.

In operation ST430, a carbon-based optical filter 200 arranged between the first mirror array and the reflective EUV mask 130 may primarily filter light OBL having the OoB wavelength from the EUV light. The primarily filtered EUV light may be transmitted to the reflective EUV mask 130 through the pellicle 140. Thus, the primarily filtered EUV light may contain information of the mask pattern from the reflective EUV mask 130.

In operation ST440, the reflective EUV mask 130 may reflect the primarily filtered EUV light to a second mirror array.

In operation ST450, the second mirror array may reflect the EUV light reflected from the reflective EUV mask 130 to a substrate W. The EUV light may then be transmitted to a DGL membrane 300.

In operation ST460, the DLG membrane 300 may secondarily filter the light OBL having the OoB wavelength from the EUV light.

In operation ST470, a photoresist film on a substrate W may be irradiated by the secondarily filtered EUV light. The exposed photoresist film may then be developed to form the photoresist pattern on the substrate W based on the information from the mask pattern in the reflective EUV mask 130.

A gas may be released from the photoresist film by the EUV light. A DGL membrane 300 may block the gas released from the photoresist film. Thus, the contaminations of the first and second mirror arrays, the pellicle 140 and the reflective EUV mask 130 may be prevented.

Alternatively, the EUV lithography method may be performed using the apparatus 100 in FIG. 1, the apparatus 100a in FIG. 10, the apparatus 100b in FIG. 11, the apparatus 100d in FIG. 13, the apparatus 100e in FIG. 14, the apparatus 500 in FIG. 15 or the apparatus 500a in FIG. 16.

According to an example embodiment, a carbon-based optical filter may filter light having the OoB wavelength from the EUV light. When the EUV lithography apparatus includes a pellicle configured to protect the EUV mask, a carbon-based DGL membrane may block the diffusion of gas flowing from the photoresist film to the pellicle and filter the light having the OoB wavelength from the EUV light. Thus, the light OBL having the OoB wavelength may be filtered from the EUV light passing through the carbon-based optical filter 560.

The foregoing is illustrative of an example embodiment and is not to be construed as limiting thereof. Although a few example embodiments have been described, those skilled in the art will readily appreciate that modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An extreme ultraviolet (EUV) lithography apparatus comprising:
   a light source configured to generate an EUV light;
   an EUV mask configured to pattern a photoresist film on a substrate with the EUV light;
   a pellicle between the EUV mask and the photoresist film;
   a first mirror array arranged between the light source and the EUV mask, the first mirror array configured to reflect the EUV light to the EUV mask;
   a second mirror array arranged between the EUV mask and the substrate, the second mirror array configured to reflect the EUV light to the substrate; and
   a carbon-based optical filter arranged between the EUV mask and the second mirror array configured to filter a light having an out-of-band (OoB) wavelength from the EUV light;
   a dynamic gas lock (DGL) over the substrate; and
   a carbon-based DGL membrane installed at the DGL configured to block a diffusion of a gas released from the photoresist film by the EUV light, and to filter the light having the OoB wavelength.

2. The EUV lithography apparatus of claim 1, further comprising:
   a second carbon-based optical filter between the light source and the EUV mask.

3. The EUV lithography apparatus of claim 1, wherein the carbon-based optical filter comprises a carbon-based film.

4. The EUV lithography apparatus of claim 3, wherein the carbon-based film comprises graphene.

5. The EUV lithography apparatus of claim 1, wherein the carbon-based optical filter comprises:
   a zirconium base; and
   a carbon-based film on at least one surface of the zirconium base.

6. The EUV lithography apparatus of claim 1, wherein the carbon-based optical filter comprises:
   carbon nanotubes (CNT); and
   a carbon-based film arranged on at least one surface of the CNT.

7. The EUV lithography apparatus of claim 1, wherein the EUV mask comprises a reflective EUV mask configured to reflect the EUV light or a transmissive EUV mask configured to transmit the EUV light there through.

8. The EUV lithography apparatus of claim 1, wherein the carbon-based DGL membrane comprises a material and a structure substantially the same as those of the carbon-based optical filter.

9. An extreme ultraviolet (EUV) lithography apparatus comprising:
   a light source configured to generate an EUV light;
   a reflective EUV mask configured to reflect the EUV light to a photoresist film on a substrate;
   a pellicle configured to protect the reflective EUV mask;
   a mirror array arranged between the pellicle and the substrate, the mirror array configured to reflect the EUV light to the substrate;
   a carbon-based optical filter arranged between the pellicle and the mirror array configured to filter light having an OoB wavelength;
   a dynamic gas lock (DGL) arranged over the substrate; and
   a carbon-based DGL membrane installed at the DGL, the carbon-based DGL membrane configured to block a diffusion of a gas, released from the photoresist film by the EUV light, and to filter a light having an OoB wavelength in the EUV light.

10. The EUV lithography apparatus of claim 9, wherein the carbon-based optical filter and the carbon-based DGL membrane comprises a carbon-based film.

11. The EUV lithography apparatus of claim 9, wherein each of the carbon-based optical filter and the carbon-based DGL membrane comprises:
    a zirconium base; and
    a carbon-based film arranged on at least one of surface of the zirconium base.

12. The EUV lithography apparatus of claim 9, wherein each of the carbon-based optical filter and the carbon-based DGL membrane comprises:
    carbon nanotubes (CNT); and
    a carbon-based film arranged on at least one of surface of the CNT.

13. An extreme ultraviolet (EUV) lithography apparatus comprising:
    a light source configured to generate an EUV light;
    a reflective EUV mask configured to reflect the EUV light to a photoresist film on a substrate;
    a first mirror array arranged between the light source and the reflective EUV mask to reflect the EUV light to the reflective EUV mask;
    a pellicle configured to protect the reflective EUV mask from a gas released from the photoresist film by the EUV light;
    a second mirror array arranged between the reflective EUV mask and the substrate to reflect the EUV light to the substrate;
    a carbon-based optical filter arranged between the reflective EUV mask and the second mirror array;
    a dynamic gas lock (DGL) arranged over the substrate; and
    a carbon-based DGL membrane installed at the DGL to block the gas released from the photoresist film by the EUV light, and to filter light having an OoB wavelength.

14. The EUV lithography apparatus of claim 13, wherein the carbon-based optical filter and the carbon-based DGL membrane comprises a carbon-based film.

15. The EUV lithography apparatus of claim 13, wherein each of the carbon-based optical filter and the carbon-based DGL membrane comprises:
   a zirconium base; and
   a carbon-based film arranged on at least one of surface of the zirconium base.

16. The EUV lithography apparatus of claim 13, wherein each of the carbon-based optical filter and the carbon-based DGL membrane comprises:
   carbon nanotubes (CNT); and
   a carbon-based film arranged on at least one surface of the CNT.

* * * * *